United States Patent [19]
Tenne et al.

[11] Patent Number: 5,958,358
[45] Date of Patent: Sep. 28, 1999

[54] ORIENTED POLYCRYSTALLINE THIN FILMS OF TRANSITION METAL CHALCOGENIDES

[75] Inventors: Reshef Tenne, Rehovot; Gary Hodes, Gezer; Lev Margulis, Rehovot, all of Israel

[73] Assignee: Yeda Research and Development Co., Ltd., Rehovot, Israel

[21] Appl. No.: 08/657,431

[22] Filed: Jun. 3, 1996

Related U.S. Application Data

[63] Continuation of application No. 08/352,150, Dec. 1, 1994, abandoned, which is a continuation-in-part of application No. 08/084,504, Jul. 1, 1993, abandoned.

[30] Foreign Application Priority Data

Jul. 8, 1992 [IL] Israel .......................................... 102440
Jan. 26, 1993 [IL] Israel .......................................... 104513

[51] Int. Cl.⁶ ................................................. C30B 29/46
[52] U.S. Cl. ......................... 423/561.1; 423/53; 423/549; 117/88; 117/921
[58] Field of Search ..................................... 437/108, 109; 427/281, 283; 117/88, 921; 423/59, 53, 509, 561.1; 438/268, 269

[56] References Cited

PUBLICATIONS

J.K. Burdett et al., "Polyhedral Clusters in Solids: The Electronic Structure of Pentlandite," Journal of the American Chemical Society, 109, (1987), pp. 4081–4091.

W.K. Hofmann, "Thin films of molybdenum and tungsten disulphides by metal organic chemical vapour deposition," Journal of Materials Science, 23 (1988), pp. 3981–3986.

D.A. Keszler et al., "New Ternary and Quaternary Transition–Metal Selenides: Syntheses and Characterization," Journal of Solid State Chemistry, 57, (1985), pp. 68–81.

M.K. Agarwal et al., "Growth and characterization of tantalum disulfide single crystals," Bull. Mater. Sci. 1(2), (1979), pp. 107–12, (abstract only).

K. Ohta et al., "Sulfurization of titanium in sulfer vapor," Denki Kagaku, 41(9), (1973), pp. 697–701, (abstract only).

A. Jäger–Waldau et al., "$MoS_2$ thin films prepared by sulphurization," Applied Surface Science, (1993), pp. 465–472.

A. Jäger–Waldau et al., "$WSe_2$ Thin Films Prepared by Soft Selenization," Thin Solid Films, 200 (1991), pp. 157–164.

A. Jäger–Waldau et al., "Composition and Morphology of $MoSe_2$ Thin Films," Thin Solid Films, 189 (1990), pp. 339–345.

J. Moser et al., "Texture charasterization of sputtered $MoS_2$ thin films by cross–sectional TEM analysis," J. Phys. D: Appl. Phys. 23 (1990), pp. 624–626.

M. Genut et al., "Preparation and microstructure of $WS_2$ thin films," Thin Solid Films, 217 (1992), pp. 91–97.

R. Tenne et al., "Polyhedral and cylindrical structures of tungsten disulphide," Nature, vol. 360, (Dec. 3, 1992), pp. 444–446.

Y. Feldman et al., "High–Rate, Gas–Phase Growth of $MoS_2$ Nested Inorganic Fullerenes and Nanotubes," Science, vol. 267, (Jan. 13, 1995), pp. 222–225.

(List continued on next page.)

Primary Examiner—Robert Kunemund
Attorney, Agent, or Firm—Browdy and Neimark

[57] ABSTRACT

A method of preparing a polycrystalline thin film of a transition metal chalcogenide of an orientation on a substrate which includes (a) depositing a layer of a transition metal material or mixtures thereof on the substrate; and (b) heating the layer in an open system in a gaseous reducing atmosphere containing one or more chalcogen materials for a time sufficient to allow the transition metal material and the chalcogen material to react and form the oriented polycrystalline thin film, the thin film being substantially exclusively oriented in the orientation. Also provided is a method of synthesizing structures of a transition metal chalcogenide selected from the group consisting of single layer or nested or stuffed inorganic fullerenes and nanotubes, including the step of reacting a transition metal compound with a volatile chalcogen compound in a reducing atmosphere at a temperature between about 750° C. and about 1000° C.

6 Claims, 13 Drawing Sheets

OTHER PUBLICATIONS

Jäger–Waldau et al, "Wse$_2$ Thin Films Prepared by Soft Selinization" Thin Films, 200 (1991) pp. 157–164.

Jäger–Waldau et al, Composition& Morphology of MoSe$_2$ Thin Solid Films, 189(1990)pp.339–345.

Jäger–Waldau et al, "MoS$_2$ Thin Films Prepared by Sulfurization" Appl. Sur. Sci. (1993) pp. 465–472.

T.L. Chu et al, "Large Grain Copper Indium Diselinide Films" J. Electrochem. Soc. Solid State Science & Tech. vol. 131, No. 9, (Sep. 1984) pp. 2181–2185.

Burdett et al., "Polyhedral Clusters in Solids: The Electronic Structure of Pentlandite" J. Amer. Chem. Soc. 109, (1987) pp. 4081–4091.

Hofmann, "Thin Films of Molybdenum and Tungsten Disulfides by Metal Organic Chemical Vapour Deposition", J. Of Materials Science, 23 (1988), pp. 3981–3986.

Keszler et al, "New Ternary and Quaternary Transition–Metal Selenides: Sybtheses and Characterization", J. Of Solid State Chem. 57, (1985), pp. 68–81.

Agarwal, et al "Growth and Chabacterization of Tantalum Disulfide Single Crystals"Bu. Mater. Sci. 1(2) (1979) pp. 107–112 (abstract only).

Ohta et al, "Sulfurization of Titaniom in Sulfur Vapor" Denki Kagaku, 41(9), (1973) pp. 697–701 (Abs. only).

Moser et al, "Texture Characterization of Sputtered MoS$_2$ Thin Films by Cross–Sectional TEM Analysis" J. Phys. D: Appl. Phys. 23 (1990), pp. 624–626.

Tenne et al "Polyhedral & Cylindrical Structures of Tungsten Disulfide" Nature, vol. 360 (Dec. 3, 1992) pp. 444–446.

Genut et al "Preparation & Microsructure of WS$_2$ Thin Films", Thin Solid Films 217 (1992) pp. 91–97.

Feldman et al "High–Rate, Gas–Phase Growth of MoS$_2$ Nested Inorganic Fullerenes and Nanotubes" Science, vol. 267, (Jan. 13, 1995) pp. 222–225.

Galun et al "2–D Crystallization of Layered Metal Dichalcogenides on Amorphous Substrates" No publication data given.

Salitra et al "Highly Oriented Wse$_2$ Thin Films Prepared by Selenization of Evaporated WO$_3$" Thin Solid Films, 245 (1994) pp. 180–185.

Ballif et al "Preparation and Characterization of Highly Oriented, Photoconducting WS$_2$ Thin Films" Appl. Phys. A62, pp. 543–546 (1996).

Ponomarev et al "Electrochemical Deposition of MoS2 Thin Films by Reduction of Tetrathiomolybdate" No publication data given.

Mattaus et al, "Highly Textured Films of Layered Metal Disulfide 2H–WS2: Preparation Conditions and Optoelectronic Properties" No publication data given.

$MoS_2$

SUBSTRATE

TYPE 1

$MoS_2$

SUBSTRATE

TYPE 2

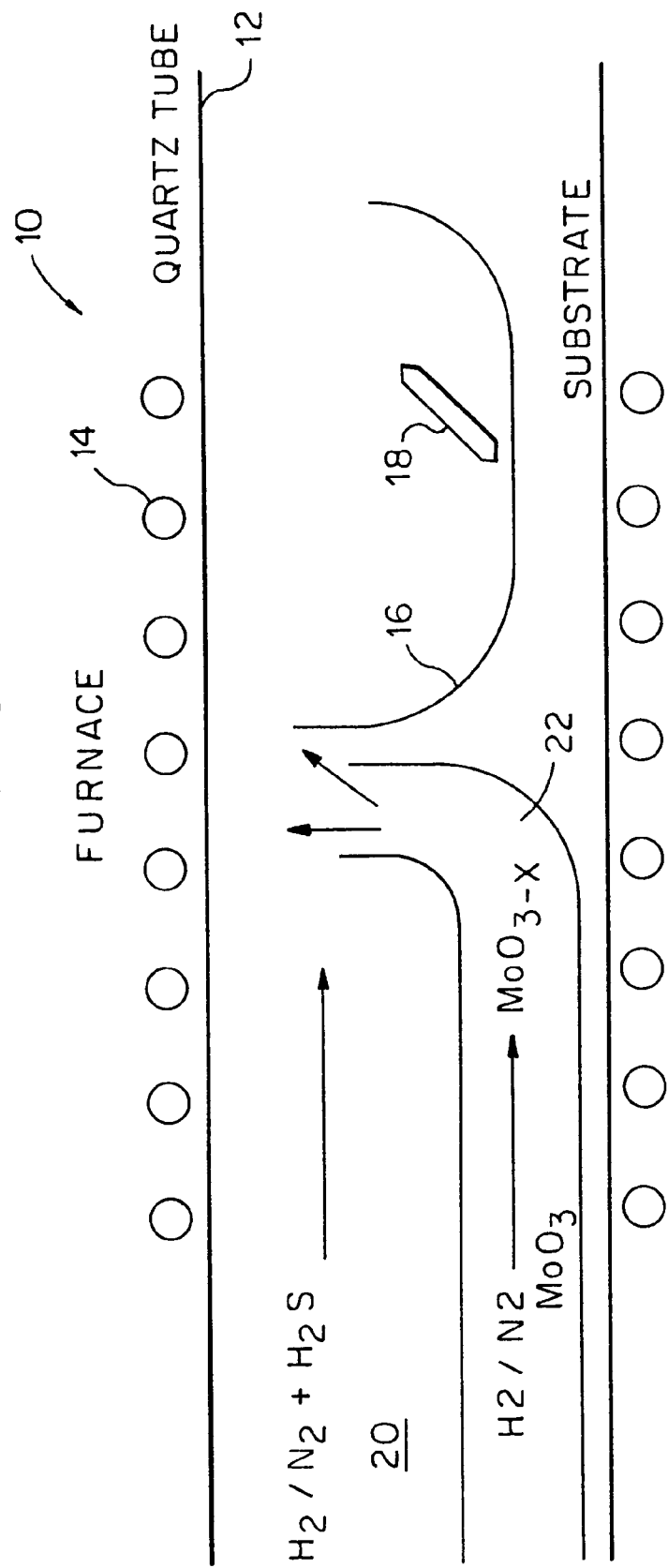

30 nm

ORIENTED POLYCRYSTALLINE THIN FILMS OF TRANSITION METAL CHALCOGENIDES

RELATED APPLICATIONS

The present application is a continuation of parent application Ser. No. 08/352,150, filed Dec. 1, 1994, now abandoned, itself a continuation-in-part of applicants' then copending application Ser. No. 08/084,504, filed Jul. 1, 1993, now abandoned.

FIELD AND BACKGROUND OF THE INVENTION

The present invention relates to specially oriented polycrystalline thin films of transition metal chalcogenides with layered structure and to methods for their fabrication and more particularly, to polycrystalline thin films of semiconducting transition metal dichalcogenides which are oriented so that the basal plane of the crystallites is substantially exclusively parallel to the substrate surface, and to methods for their fabrication.

There has been recent interest in the preparation of polycrystalline thin films of semiconducting transition metal dichalcogenides, e.g., $WS_2$, $WSe_2$, $MoS_2$ and $MoSe_2$. Possible applications include electrochemical and photovoltaic solar cells (see H. D. Abruna and A. J. Bard, J. Electrochem. Soc., 129 (1982) 673; G. Djemal et al., Sol. Energy Mater., 5 (1981) 403). Interest also exists in use of such as thin films in solid lubrication, such in high or low temperature environments or under ultra high vacuum where liquid lubricants are not suitable (see H. Dimigen et al., Thin Solid Films, 64 (1979) 221). Other possible applications involve battery cathodes (see J. Rouxel and R. A. Brec, Rev. Mater. Sci., 16 (1986) 137), and catalysis (see R. R. Chianelli, Catal. Rev. Sci. Eng., 26 (1984) 361). These thin films possess a layered-type structure with strong anisotropy of their mechanical and electrical properties. The chemical bonding is much stronger within the layers (covalent bonds) than between them (Van der Waals (VdW) bonds) (see J. A. Wilson and A. D. Yoffe, Adv. Phys., 18 (1969) 193). Polycrystalline thin films of transition metal chalcogenides ordinarily grow with a lamellar structure in which the basal (or VdW) planes are perpendicular to the substrate (see R. Bichsel and F. Levy, Thin Solid Films, 116 (1984) 367; P. A. Bertrand, J. Mater. Res., 4 (1989) 180). However, for photovoltaic as well as for solid lubrication applications, growth with the VdW planes parallel to the substrate is desired (see P. D. Fleischauer, Thin Solid Films, 154 (1987) 309).

Polycrystalline thin films of transition metal dichalcogenides have been reported to be prepared mainly by sputtering the transition metal dichalcogenides (see R. Bichsel and F. Levy, Thin Solid Films, 116 (1984) 367; A. Mallouky and J. C. Bernede, Thin Solid Films, 158 (1988) 285), by electrochemical deposition (see S. Chandra and S. Sahu, J. Phys. D., 17 (1984) 2115) and by soft selenization or sulfurization in a closed tube system as was recently reported by Jager-Waldau et al. for tungsten (see A. Jager-Waldau and E. Bucher, Thin Solid Films, 200 (1991) 157) and molybdenum (see A. Jager-Waldau et al., Thin Solid Films, 189 (1990) 339) diselenides and disulfides. The average crystallite size obtained was between 10 and 80 nm.

In the soft selenization method, thin sputtered tungsten or molybdenum films were reacted with selenium in a closed tube system for tens to hundreds of hours. As a result, two types of orientations were obtained, with the basal plane of the crystallites being oriented either predominantly perpendicular (hereinafter Type I) or predominantly parallel (hereinafter Type II) to the substrate surface. The films of Type II resulting from the soft selenization method also included several percent of Type I mixed in, and are never substantially exclusively Type II. Since photovoltaic cells require films which are virtually exclusively parallel oriented, these films could not be used successfully for photovoltaic cells.

Thin films of materials such as $MoS_2$, $MoSe_2$, $MoTe_2$, $WS_2$, $WSe_2$, $ZrS_2$, $ZrSe_2$, $HfS_2$, $HfSe_2$, $PtS_2$, $ReS_2$, $ReSe_2$, $TiS_3$, $ZrS_3$, $ZrSe_3$, $HfS_3$, $HfSe_3$, $TiS_2$, $TaS_2$, $TaSe_2$, $NbS_2$, $NbSe_2$, and $NbTe_2$ have been studied for both their photovoltaic and tribological properties. It has been found in both cases that thin films with Van der Waals (VdW) planes parallel to the substrate (Type II) are much preferable to those with VdW planes perpendicular to the substrate (Type I). This is especially true for photovoltaic applications where Type I structures normally exhibit very poor photovoltaic activity and where even a small percentage of Type I orientation in a predominantly Type II structure can severely degrade photovoltaic performance. It is believed that Type I structures act as recombination sites and as centers for electrochemical corrosion (see H. J. Lewerenz et al., J. Am. Chem. Soc. 102 (1980) 1877).

"Large Grain Copper Indium Diselenide Films", T. L. Chu et al., J. Electrochem. Soc., Sept. 1984, p. 2182, refers to the preparation of $CuInSe_2$ films in an open tube reactor in the presence of a forming gas (a mixture of 5% hydrogen and 95% nitrogen). Since this is an almost isotropic material, there is no reason to expect any preferred orientation for the $CuInSe_2$ film. One skilled in the art would not have thought to use this method with an anisotropic material like $WS_2$ or $WSe_2$.

It has heretofore been unknown how to make polycrystalline thin films of transition metal chalcogenides which are substantially exclusively of Type II. Furthermore, it has been unknown how to make such polycrystalline thin films which are continuous films wherein the average crystallite size is very large (a few mm by a few mm).

There is thus a widely recognized need for, and it would be highly advantageous to have, polycrystalline thin films of semiconducting transition metal dichalcogenides, and methods for making these thin films, which will be oriented substantially exclusively as a Type II structure.

SUMMARY OF THE INVENTION

According to the present invention there is provided a method of preparing a polycrystalline thin film of a transition metal chalcogenide, or mixtures thereof, with layered structure, of an orientation on a substrate, comprising: (a) depositing a layer of a transition metal material or mixtures thereof on the substrate; and (b) heating the layer in an open system in a gaseous atmosphere containing one or more chalcogen materials for a time sufficient to allow the transition metal material and the chalcogen material to react and form the oriented polycrystalline thin film, said thin film being substantially exclusively oriented in the orientation.

Also according to the present invention there is provided an oriented polycrystalline thin film of a transition metal chalcogenide made by the above method.

Further according to the present invention there is provided a polycrystalline layered thin film of a transition metal chalcogenide, or mixtures thereof, on a substrate, whose Van der Waals planes are substantially exclusively parallel to the substrate surface.

According to a preferred embodiment of the invention, the polycrystalline layered thin film further includes an ultra-thin (less than 100 Å) intermediate layer between the substrate and the transition metal material chalcogenide, said intermediate layer including at least one metal or metal compound, such as Ni, Sn, Co, etc., which forms a metal chalcogenide having a melting point less than about 850° C.

Further according to the present invention there is provided a generally closed structure substantially circular in cross-section, made up of single layer or nested transition metal chalcogenides. This structure, which has been variously termed 'microtubular', 'nanotubular', 'fullerene-like', 'faux fullerene' (as in Sci. Am., February 1993, p. 24), or 'nested polyhedra' may be obtained by the method of the invention. These will all be referred to hereinbelow as inorganic fullerenes and nanotubes.

Still further according to the invention there is provided a method of synthesizing stuctures selected from the group consisting of single layer, nested and stuffed nanotubes and inorganic fullerenes of a transition metal chalcogenide including the step of reacting a transition metal compound with a volatile chalcogen compound in a reducing atmosphere at a temperature between about 750° C. and about 1000° C., and preferably between about 800° C. and 900° C.

Also according to the present invention there is provided apparatus for synthesizing structures selected from the group consisting of inorganic fullerenes and nanotubes, single layer, nested and stuffed, of a transition metal chalcogenide comprising a reaction vessel, a first gas flux inlet in said vessel for a reducing gas, a tube defining a second gas flux inlet disposed in said vessel and arranged so that the second gas flux will intersect the first gas flux, a container for holding a transition metal material located in said tube downstream of said second gas flux inlet; and heating means for heating said reaction vessel during reaction.

According to further features in preferred embodiments of the invention described below, the transition metal material is a transition metal, such as tungsten, molybdenum, zirconium, hafnium, platinum, rhenium, titanium, tantalum and niobium preferably tungsten or molybdenum, or a compound containing a transition metal, while the chalcogen material is a chalcogen, such as sulfur, selenium or tellurium, preferably sulfur or selenium, or a compound containing a chalcogen.

According to still further features in the described preferred embodiments the deposition is accomplished by sputtering, by vacuum evaporation, by chemical solution deposition or by electrodeposition.

According to yet further features in the described preferred embodiments the heating is conducted under reducing conditions, preferably using a gaseous atmosphere which includes hydrogen sulfide or sulfur and forming gas.

In preferred embodiments the heating takes place at a sufficiently high temperature and at a sufficiently low sulfur concentration as to form a thin layer whose crystallites have a basal plane which is oriented substantially exclusively parallel to the substrate surface, where substantially exclusively is meant to indicate more than 98% of the chains parallel to the substrate surface, preferably over 99%, most preferably over 99.9%.

The present invention successfully addresses the shortcomings of the presently known methods by providing a method which allows a thin layer to be constructed which is made up substantially exclusively of crystallites having a basal plane which is oriented parallel to the substrate surface.

The present invention discloses the formation of highly oriented films of transition metal chalcogenides, such as $WS_2$, $WSe_2$, $MoS_2$ and $MoSe_2$. The oriented thin films are grown by chalcogenizing thin tungsten or molybdenum films, using S, Se, Te, or their compounds.

According to the present invention, thin tungsten or molybdenum films are deposited onto a suitable substrate and then reacted at temperatures from 500 to 1,100° C. in an open system under a gas flow consisting of a mixture of $H_2S$ and forming gas.

The onset of the reaction between tungsten and $H_2S$ to give $WS_2$ thin films was found to depend on the substrate. For example, for quartz substrate it was found to be 650° C. Orientation of the $WS_2$ crystallites could be controlled by choice of reaction temperature and sulfur concentration in the gas flow. For example, with quartz substrate Type I structure was obtained from about 500° C. to about 850° C. while Type II was obtained from about 950° C. to about 1,100° C. Mixtures of Type I and Type II were obtained for temperatures between about 850° C. and about 950° C. Low reaction temperatures (up to 900° C.) and high sulfur concentrations lead to films where part of the Van der Waals planes are perpendicular to the substrate, while high temperatures (more than 950° C.) and low sulfur concentrations result in Van der Waals planes being parallel to the substrate.

These results may be explained as being the result of competition between the reaction rate, nucleation (density of nucleii) and the rate of crystallization. The higher temperatures permit higher rates for surface diffusion and, hence, lower density of nucleii which givers preference to Type II crystallization. The importance of these results lies in the fact that the latter orientation is needed for solar cells and optimum lubrication uses, yet it is the former which has been commonly encountered in the majority of reported cases.

BRIEF DESCRIPTION OF THE DRAWINGS

The invention is herein described, by way of example only, with reference to the accompanying drawings wherein:

FIG. 8 is a schematic representation of one embodiment of a gas phase reactor according to the invention to produce $MoS_2$ inorganic fullerenes (IF);

FIG. 10b is a high-magnification TEM image of the nanotube indicated by an arrow in FIG. 10a.

DESCRIPTION OF THE PREFERRED EMBODIMENTS

Figure 1A:
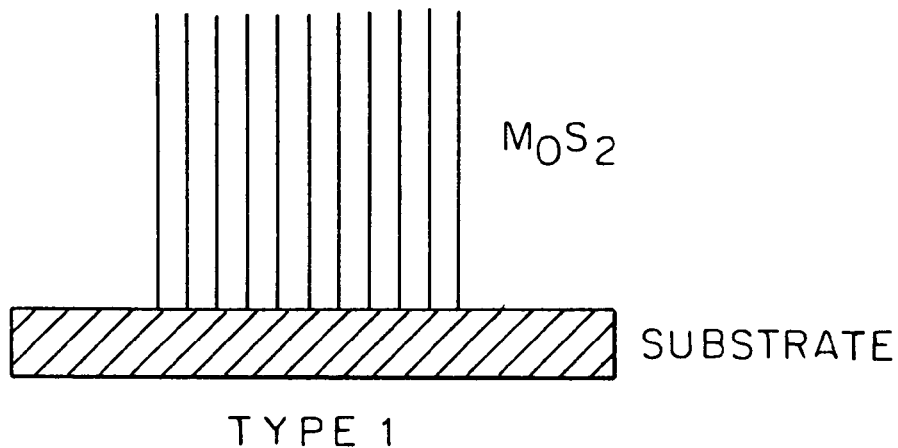
FIG. 1 is a schematic depiction of Type I and Type II orientation of layers of polycrystalline thin films on a substrate.
Figure 1B:
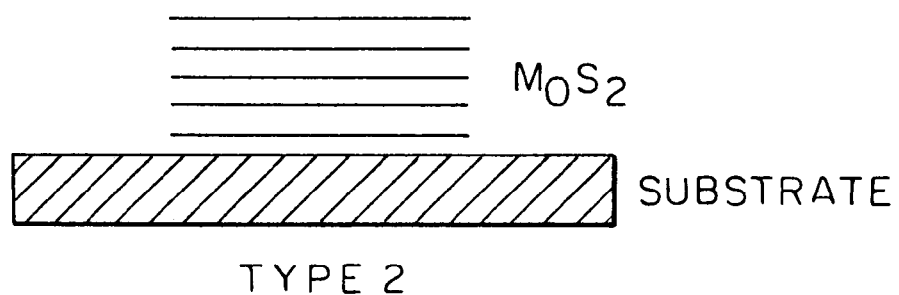

The present invention is of a method of forming a highly oriented thin polycrystalline thin layer which is particularly useful in photovoltaic and in lubrication applications. Specifically, the present invention can be used to create thin layers in which the layers lie substantially exclusively parallel to the plane of the substrate. The invention also relates to a method for synthesizing relatively large quantities of inorganic fullerenes and nanotubes. For ease of discussion, these inorganic structures and others like them, including nanotubes and polyhedral structures such as fullerenes, single layer, nested and stuffed, will be referred to throughout the specification as "Inorganic Fullerenes" or IF.

Films of $MX_2$, where M is Mo, or W and X is S, Se or Te, prepared by annealing sputter-deposited tungsten on quartz in flowing $H_2X$ or elemental X vapor exhibit different crystal textures depending on the preparation conditions. Low chalcogenizing temperatures lead to substantially exclusively Type I texture (VdW planes vertical) which is the texture usually obtained when films of this, or similar materials, are prepared by various methods. Higher temperatures give Type II texture (VdW planes parallel to the substrate, which is the desirable texture in many cases) with either very small amounts (about 1%) of vertical VdW plane component (for high chalcogen concentration in the gas flow) or no TEM-measurable amounts of this component for low chalcogen concentrations. It is believed that the phenomenon is the result of competition between the reaction rate to $MX_2$ and the rate of nucleation and crystallization of the film. A slow deposition rate of the sputtered M films leads to high amounts of Type I texture, even at 1000° C., which may be due to impurities in the slowly growing film.

In a process according to the present invention, a polycrystalline thin film of a desired orientation on a substrate is formed by first depositing a layer of a transition metal material on the substrate. Any suitable substrate may be used. Preferably, the substrate is quartz, glass or titanium. The substrate may also be tungsten or molybdenum foils.

It has been discovered that the substrate plays an important role in determining both the temperature at which reaction between, for example, tungsten and $H_2S$ occurs and the orientation of the $WS_2$ film. In general, the $WS_2$ phase nucleates from the metastable $WS_3$ amorphous phase. For glass substrates, reaction occurs at 400° C. The metastable amorphous $WS_3$ phase is first formed and it decomposes with the formation of the stable $WS_2$ phase. The $WS_2$ film exhibits predominantly, although not exclusively, Type II orientation at 500° C. For quartz substrates, reaction occurs at 650° C. and the orientation is predominantly Type I below 950° C. and substantially exclusively Type II at higher temperatures. Molybdenum substrates give Type I orientation even at 1000° C. and bulk tungsten (or tungsten sputtered onto tungsten) give randomly oriented $WS_2$.

The transition metal material may be a transition metal or a compound containing a transition metal, or a mixture of transition metals and/or compounds containing a transition metal, such as tungsten, molybdenum, zirconium, hafnium, platinum, rhenium, niobium, tantalum and titanium. Preferably, the transition metal is tungsten or molybdenum, or mixtures thereof.

Deposition of the transition metal or transition metal compound onto the substrate may be accomplished in any suitable way. These may include sputtering, vacuum evaporation, chemical solution deposition and electrodeposition.

After the deposition of the layer of transition metal material, the layer is heated in a gaseous atmosphere containing a chalcogen material which may be one or more chalcogens and/or one or more compounds containing one or more chalcogens. Preferably, the chalcogen material is sulfur or selenium or mixtures thereof.

Heating is continued at a sufficiently high temperature and for a sufficiently long time to allow the transition metal material to react with the chalcogen material and form the oriented polycrystalline thin film.

Optimal temperatures and durations of heating to be used depend on the precise nature of the reactants and on the desired orientation of the polycrystalline layers.

The heating is preferably carried out under reducing conditions. The gaseous atmosphere under which the reaction is carried out preferably includes $H_2X$ or elemental X and forming gas.

The heating takes place at a sufficiently high temperature and at a sufficiently low chalcogen concentration for the formation of a thin layer whose crystallites have a basal plane which is oriented substantially exclusively parallel to the substrate surface. The suitable temperature ranges depend on the nature of the chalcogen and the transition metal, as well as on the substrate. Typically, the heating temperature is in the range of from about 600° C. to about 1,100° C. The precise temperature ranges depend on the substrate used and on whether it is desired to produce Type I or Type II structures. For example, for a quartz substrate, Type I structures are obtained at temperatures below about 950° C. while Type II structures are achieved at temperatures of about 950° C. and above. The suitable chalcogen concentration ranges depend on the nature of the chalcogen and the transition metal, as well as on the substrate. E.g., for sulfur, the concentration is in the range of from one or a few ppm to about 10%.

The principles and operation of a method and product according to the present invention may be better understood with reference to the examples and descriptions below, including the accompanying drawings. A number of examples are given to illustrate various aspects of the present invention. The discussion which follows concentrates on the $WS_2$ and $MoS_2$ system, it being understood that this discussion is illustrative only and is not intended to limit the scope of the present invention to that system.

EXAMPLE 1

Thin films of molybdenum (about 50 nm thick) were ion beam sputtered onto quartz slides, at an argon pressure (in the chamber) of $2\times10^{-4}$ Torr. The sputtering rate was about 10 nm $min^{-1}$. The samples were reacted in an open quartz furnace with forming gas (5% $H_2$, 95% $N_2$, 50 $cm^3$ $min^{-1}$ and residual sulfur on the walls of the quartz tube). The reaction temperature was 1000° C. After the furnace reached the desired temperature and a uniform gas flow was maintained, the samples were introduced into the hot zone of the reaction chamber, by a magnet from outside the quartz tube, for 1 hour. After reaction the samples were moved back to the cold zone of the reaction chamber, where a temperature of about 60° C. was maintained.

The reaction products were characterized by X-ray diffraction (XRD) (CuK$\alpha$ radiation), transmission electron microscopy (TEM), electron probe microanalysis (EPMA), Auger electron spectroscopy (AES), optical transmission spectroscopy (OTS) and sheet resistivity measurements using a four-point probe.

Thin foils for TEM study were obtained by peeling off the films from the quartz substrate by immersing in very dilute HF (about 1%).

The analyses indicated that the resulting structure had exclusively Type II orientation with more than 99.9% of the structure being oriented parallel to the substrate.

EXAMPLE 2

A solution of ammonium thiomolybdate was prepared by saturating 50 ml of an aqueous solution of ammonium molybdate (5 g) with $H_2S$. This solution was used as an electrolyte, with a Pt anode and a Ti cathode. A constant current of 1 mA cm$^{-2}$ for 20 minutes was passed through the electroplating cell, which was cooled in an ice-water bath.

The layer was analyzed by Auger electron spectroscopy and found to be $MoOS_2$. It was annealed in 10% $H_2S$ in argon at 700° C. for 30 minutes. Subsequent analysis of the annealed film showed it to be $MoS_2$. The resulting structure was of mixed Type I and Type II orientation.

EXAMPLE 3

Ammonium molybdate (2 g) and elemental sulfur (0.1 g) were dissolved in dimethyl sulfoxide (50 ml) at 130° C. This solution was used as an electrolyte in an electrolysis cell using a carbon anode and Ti cathode. A constant current of 0.5 mA cm$^{-2}$ was passed for 20 minutes at an electrolyte temperature of 130° C.

The resulting film was found, by electron diffraction, to be composed of $MoO_2$ crystals. This film was annealed in a mixture of forming gas with 0.1% $H_2S$ at 800° C. for 20 minutes, which converted it to $MoS_2$. The resulting structure was of mixed Type I and Type II orientation.

EXAMPLE 4

Thin films of tungsten (about 50 nm thick) were ion beam sputtered onto quartz slides, at an argon pressure (in the chamber) of $2\times10^{-4}$ Torr. The sputtering rate was about 10 nm min$^{-1}$. The samples were reacted in an open quartz furnace with a flow of $H_2S$ (5–50 cm$^3$ min$^{-1}$) and forming gas (5% $H_2$, 95% $N_2$, 150 cm$^3$ min$^{-1}$). The reaction temperatures were controlled in the range from 500 to 1000° C. After the furnace reached the desired temperature and a uniform gas flow was maintained, the samples were introduced into the hot zone of the reaction chamber, by a magnet from outside the quartz tube, for times between 5 minutes and 5 hours. After reaction the samples were moved back to the cold zone of the reaction chamber, where a temperature of about 60° C. was maintained. The reaction products were characterized as in Example 1.

The results of the analyses are described below. The tungsten layer after deposition was found by XRD as well as by TEM to be either amorphous or with a grain size of 1 nm or less. In order to study systematically the onset of the reaction, the tungsten/quartz specimens were reacted at temperatures between 500 and 1000° C. for 30 minutes. EPMA measurements were performed after the reaction. The atomic concentrations of the elements were found to be in a good agreement with the $WS_2$ stoichiometry and did not depend on the heat treatment conditions within the experimental error of this technique.

It was verified by OTS, XRD, AES and TEM that the onset reaction temperature is 650° C. At this temperature the WS, hexagonal 2H polytype (see Powder Diffraction File, ASTM, Philadelphia, Pa., card 8 237) was formed. The sheet resistivity measurements were also in agreement with the other techniques and revealed an increase of three orders of magnitude in the resistivity of the layer between 600 and 650° C., indicating the transformation from metallic tungsten to semiconducting $WS_2$. The AES depth profile taken from such specimens showed uniform distribution of tungsten and sulfur with negligible amounts (less than 1%) of carbon and oxygen in the bulk.

TEM observations demonstrated no change in the film microstructure within the temperature range of from 650 to 900° C., although a slight tendency toward grain growth was observed with increasing reaction temperature as can be seen in the Table I below.

TABLE I

| T(°C.) | Time (hrs) | Texture | Resistivity | XRD grain size (nm) | TEM grain size (nm) |
|---|---|---|---|---|---|
| 500 | 0.5 | No rxn | $2.7 \times 10^{-3}$ | | |
| 650 | 0.5 | Type I | 6.1 | | 10 |
| 750 | 0.5 | Type I | 3.1 | | 10–13 |
| 850 | 0.5 | Type I | 2.4 | | 13–15 |
| 1000 | 0.5 | Type II | 1.3 | 30 | 30–200 |
| 1000 | 3.0 | Type II | 1.3 | 100 | 40–350 |
| 1000 | 5.0 | Type II | | 200 | 50–300 |

TEM micrograph and selected area diffraction pattern (SADP) from a specimen following reaction at 750° C. for 30 minutes clearly show the lattice image of the VdW planes, showing clear Type I orientation. The lattice spacing is shown to be approximately 6.18 Angstrom. The most intense ring on the SADP was identified with the {002} reflection as expected for Type I texture.

The XRD spectra from such specimens are in good agreement with the TEM results. XRD spectra taken from a specimen following reaction at 650° C. for 30 minutes showed the {100} and {110} reflections to be at 2Θ=32.767° and 2Θ=58/427°, respectively, which is consistent with Type I orientation.

However, in addition to the Type II orientation, also observable were small amounts (about 1%) of Type I oriented grains. The SADP revealed the absence of almost the entire {002} diffraction ring as expected for such a growth type. The commonly occurring moire patterns indicate that most of the microcrystallites with the VdW parallel orientation are mutually rotated about the c axis, and that the thicknesses of the crystallites are typically much less than the film thickness, which were about 200 nm.

XRD spectra of such specimens (1000° C., 30 minutes) showed only the {001} reflections where 1=2n corresponding to the 2H polytype of $WS_2$) and clearly indicated, in good agreement with the TEM observation, nearly exclusively Type II texture. In this case the intensity of the {002} peak was a few orders of magnitude stronger than for the specimens after reaction at lower temperatures.

It was found that the sulfur supply rate is extremely important in achieving exclusively Type II orientation. Best results were obtained when the samples were introduced into the reaction chamber for 30 minutes at 1000° C. in the presence of flowing forming gas only, without the direct addition of $H_2S$. After this treatment, it was found that the tungsten fully reacted with residual sulfur present in the reaction chamber to give $WS_2$. Moreover, the $WS_2$ was found by XRD and TEM to feature exclusively Type II orientation. No crystallites with Type I orientation could be observed in either the image or the SADP. The grain size was not uniform with some grains being as large as 1 µm, but most being noticeably smaller (about 100 nm).

TEM micrographs from a specimen reacted with residual sulfur as described above, followed by 30 minutes reaction at 1000° C. with the usual conditions of H$_2$S and forming gas flow showed an increasing number of the large grains (about 1 μm). This is of importance for photovoltaic applications, where grain size should be as large as possible.

The table above summarizes the orientation, sheet resistivity, and grain sizes as a function of reaction conditions. In addition to the TEM measurement, the grain size was also estimated by measuring the fill width at half-maximum of the XRD diffraction peak compared with a single-crystal specimen.

The results described above show that thin films of transition metal dichalcogenides grow in two preferential orientations: Type I (VdW planes perpendicular to the substrate), which is the more common growth pattern, and Type II (VdW planes parallel to the substrate).

It has been discovered that four main factors have an important influence on the texture of the tungsten disulfide thin films: (1) reaction temperature, (2) rate of the sulfur supply, (3) the deposition rate of the sputtered transition metal film, as it relates to the purity of the film and (4) the nature of the substrate.

The interaction between thin films of tungsten and H$_2$S on quartz begins at 650° C. The interaction is very quick and takes only a few minutes to be completed. It was demonstrated that, at reaction temperatures lower than 1000° C., the orientation of the WS$_2$ grains was always of Type I, while at 1000° C. most of the specimens exhibited Type II texture. Without in any way limiting the scope of the present invention, it is believed that this phenomenon results from the kinetic conditions controlling the process. In spite of the orientation difference that exists in the two temperature regions, there is no evidence that the reaction at 1000° C. (or above) starts with Type I orientation and then transforms to Type II orientation during the process. It was found that when the conditions are not ideal for Type II growth, such as low reaction temperatures or low rates of tungsten deposition, the orientation begins and remains Type I. Further reaction time or post-annealing treatments leads to grain growth but have no effect on the texture.

In contrast with work reported in the literature, which in some cases reported predominantly Type II orientation (see A. Jager-Waldau and E. Bucher, Thin Solid Films, 200 (1991) 157; A. Jager-Waldau et al., ICSFS-6, Jun. 29–Jul. 3, 1992, Paris), layers made according to the present invention can be made to contain no Type I oriented grains whatsoever. This difference is of great importance, since it is known that even very low concentrations of Type I oriented grains can severely degrade photovoltaic performance (see W. Kautek et al., Ber. Bunsenges. Phys. Chem., 83 (1979) 1000). Also, in contrast with other reported methods, the method described here is readily amenable to scaleup and can therefore be used to deposit films of large areas.

The contamination of the slowly growing tungsten film at low deposition rates is a very important factor affecting the texture. As mentioned above, in this case Type I rather than Type II growth occurs. It is believed that this behavior can be attributed to oxygen and/or water vapor adsorption which is inversely proportional to the deposition rate. If the tungsten film (deposited under normal conditions, i.e. about 10 nm min$^{-1}$) is first oxidized by heating in air, and then sulfided, there is a greater tendency to Type I orientation compared with unoxidized tungsten.

Without in any way limiting the scope of the present invention, it is believed that the results described above may be explained as follows.

Since high sulfur concentration is associated with Type I growth and low sulfur concentration is conducive of Type II growth, it is suggested that there is competition between diffusion-crystallization in the WS$_2$ lattice and the reaction of the compound formation. If the reaction is kept at a low rate, as through a low concentration of sulfur, and the diffusion-crystallization processes are speeded up, as through use of high temperatures, the layer will have more time to grow in a Type II orientation, since It is the more energetically favorable orientation, since the reaction is slower than the crystallization.

EXAMPLE 5

Figure 5:
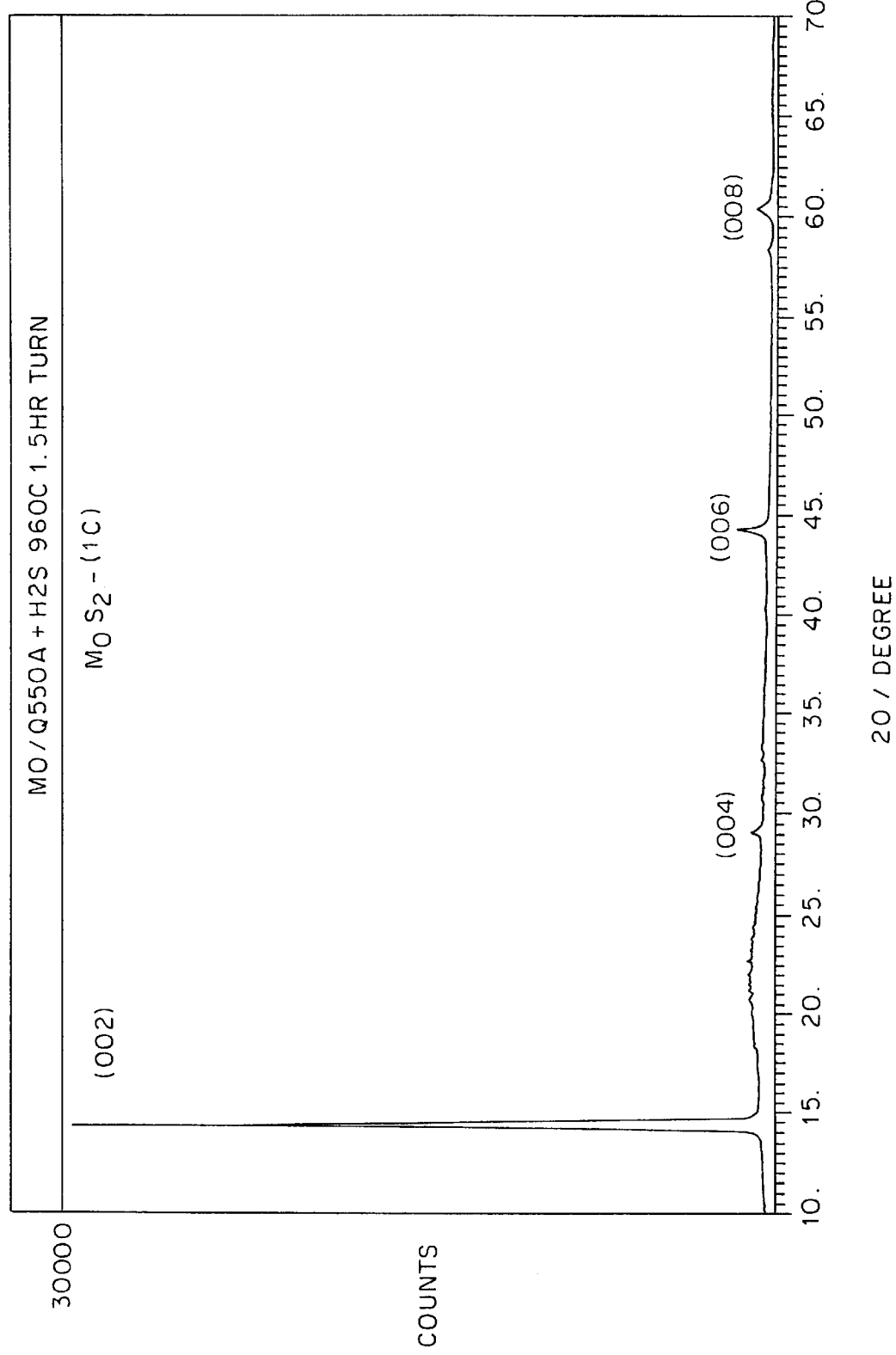
FIGS. 5 and 6 are two X-ray diffraction spectra as described in Example 5.
Figure 6:
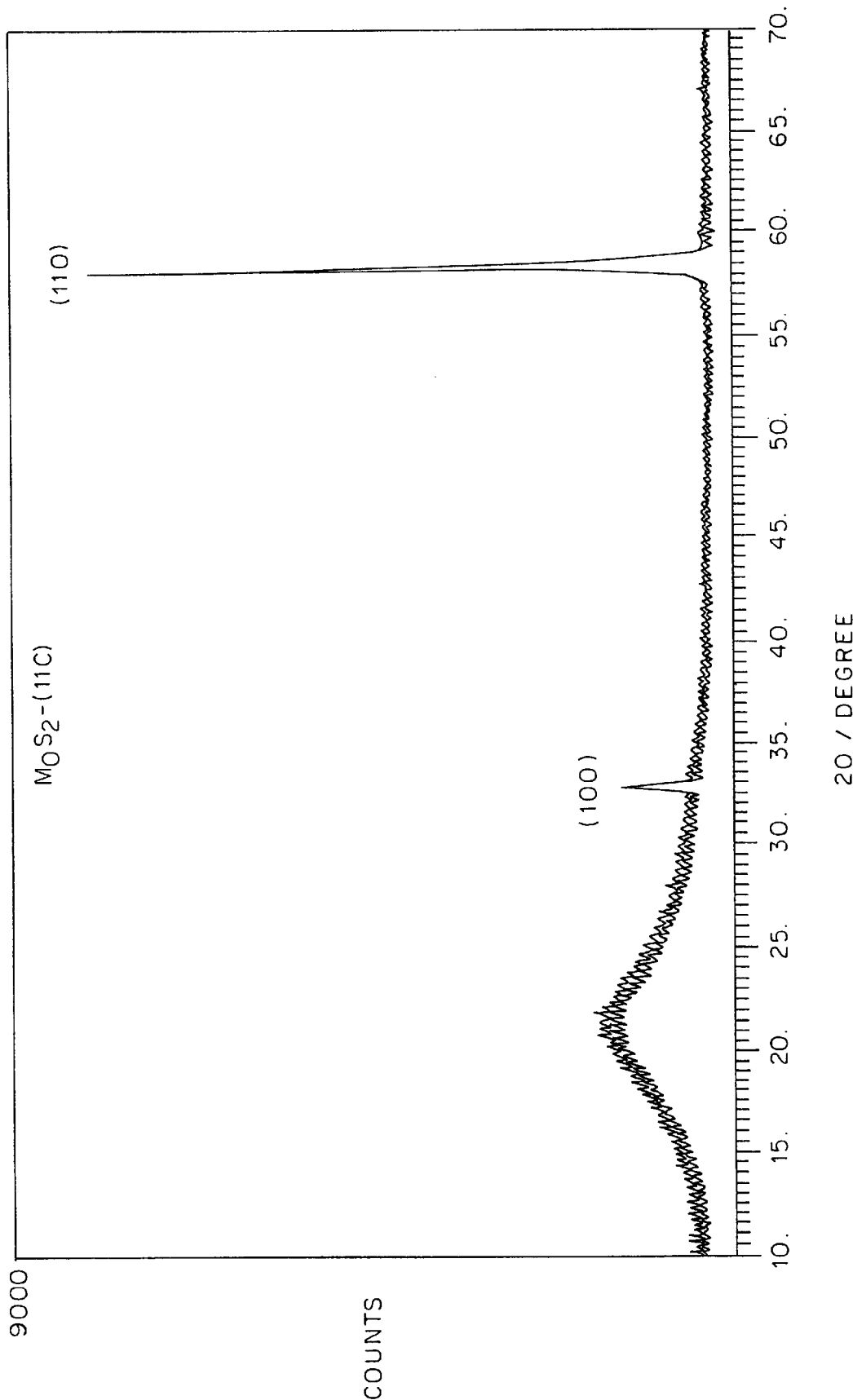

Oriented MoS$_2$ films were obtained on a quartz substrate by the following procedure. A 240–550 Angstrom Mo film was deposited on pre-cleaned quartz substrate by electron beam evaporation. The sample was fired (pre-annealed) for one hour in the atmosphere of the forming gas at 960–1000° C. X-ray powder diffraction spectra showed that under these conditions the Mo recrystallized with a typical grain size of one micrometer. Subsequently H$_2$S was added to the reaction mixture and annealing continued for one to three hours. At 960° C. the orientation of the MoS$_2$ crystallites was almost exclusively Type II structures, as shown in FIG. 5. Firing at 1000° C. without pre-annealing lead to preferred Type I orientation, as shown in FIG. 6.

EXAMPLE 6

Oriented Type II thick films (2000 Å and above in thickness) of MoSe$_2$ and WSe$_2$ were obtained by annealing Mo (W) or MoO$_X$ (WO$_X$) film on a quartz substrate in an atmosphere of forming gas (N$_2$/H$_2$=95/5) and Se gas at temperatures greater than 950° C. for over one hour. The metal (metal oxide) film was obtained by preheating a piece of selenium at 300° C. in an auxiliary furnace, outside the main chamber. For film thickness greater than 2000 Å, a repetitive process of metal (or metal oxide) deposition (2000 Å) and annealing was found advantageous. The films exhibited excellent orientation, i.e., were highly Type II, as confirmed by powder X-ray diffractometry. However, the crystallites were small and the film exhibited much mosaicity.

According to a preferred embodiment of the invention, in order to improve the crystallinity and the orientation of the films, a thin (3–10 nm) film of Ni, or other metal which forms a metal chalcogenide having a melting point below about 850° C., may be deposited as an intermediate buffer layer between the substrate and the transition metal (or oxide thereof) film. The Ni reacts with the chalcogen gas in the reactor, forming a Ni$_y$Se$_x$ eutectic which melts at elevated temperatures (greater than 750° C.). Therefore, the WSe$_2$ film grows over a thin Ni$_3$Se$_2$ melt, which results in a highly crystalline film substantially exclusively oriented with basal planes parallel to the substrate.

Figure 7A:
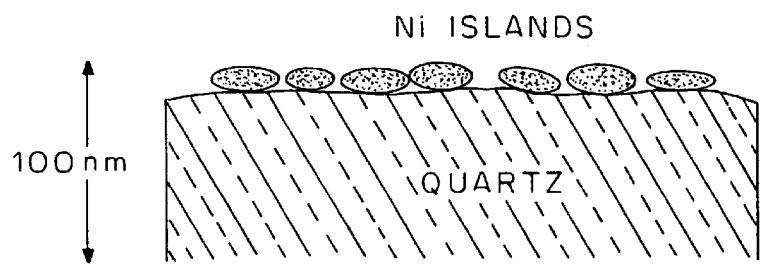
FIGS. 7a to 7c are schematic illustrations of the operation of Van der Waals rheotaxy in the present invention.
Figure 7B:
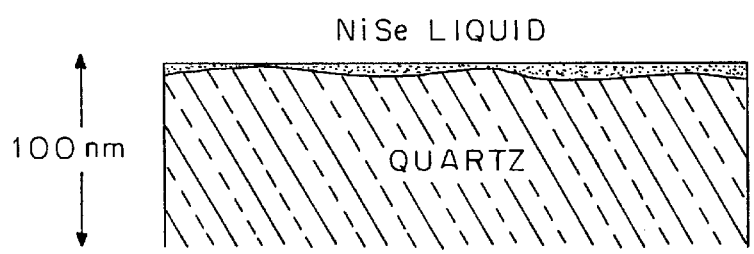
Figure 7C:
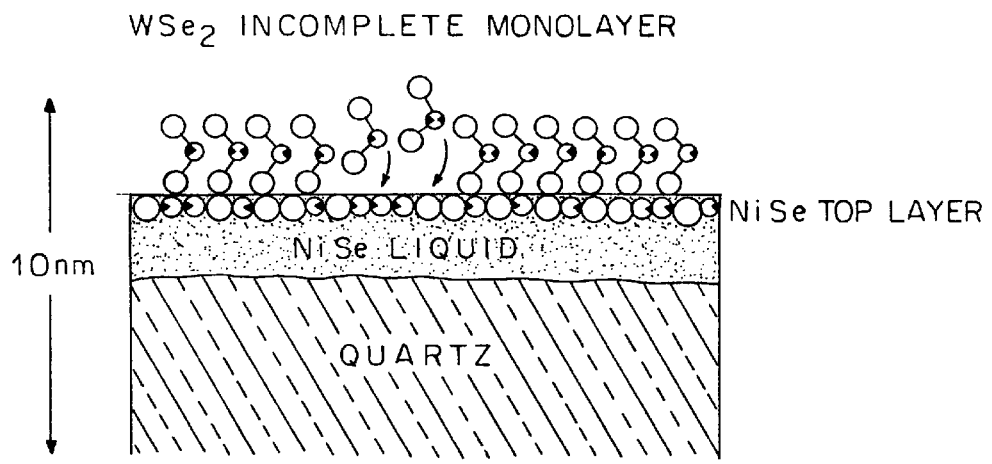

The mechanism of thin film formation is believed to be van der Waals rheotaxy, which is illustrated in FIGS. 7a, 7b and 7c. As can be seen in FIG. 7a, the deposited ultra-thin metal film, here nickel, forms discrete islands of crystallites on the substrate. Selenization of the metal results in a melt which forms a continuous film (FIG. 7b). The smooth upper surface of the melt is an ideal surface for the transition metal chalcogenides to grow on. Other metal films, which have low melting temperature eutectics, like Sn, Co, or combinations thereof, can be used instead of the Ni film.

Once the first film of WSe$_2$ has been deposited, a second oriented WSe$_2$ film can be grown on top. This will reduce the Ni or other metal contamination in the top layer, and improve the photovoltaic properties of the film. The resulting films consist of crystallites as large as a few mm² with no mosaicity. The films are continuous and crack-free and adhere very well to the substrate. The open tube method is used for preparation of these $WSe_2$ films by reaction of vacuum evaporated $WO_3$ films in a flowing mixture of selenium vapor and forming gas. In order to improve the adhesion and especially the lateral electrical conductivity to the current collector, a substrate of quartz coated with a second ultra-thin (less than 200 Å and typically about 100 Å) metal film was used. This layer is preferably coated on the substrate below the layer of Nickel or other metal (if any), although it can also be applied over a first metal layer. Most preferably, this second layer consists of a metal like niobium, which forms a semi-metal niobium selenide. In addition, the use of a Nb coating renders the $WSe_2$ film p-type, instead of the usual n-type.

EXAMPLE 7

Thin films of tungsten oxide (about 2000 Å thick) were prepared by vacuum evaporation of $WO_3$ powder (BDH Chemicals, England). The pressure during evaporation was $5\times10^{-5}$ Torr, and the deposition rate, ca. 10 Å/s. The substrate used was quartz coated with a metal film. Among the metals used were Ni; Cr; and a Ni—Cr alloy ($[Cr]_{at.\ \%}/[Ni]_{at.\ \%}$=5.2). The Ni—Cr films (200 Å) were deposited by electron beam evaporation of the alloy at a base pressure of approximately $10^{-6}$ Torr. Ni and Cr films (30 and 200 Å each) were deposited by resistive heating.

The samples were reacted in an open quartz tube furnace under the flow of a mixture of forming gas (5% $H_2$, 95% $N_2$, 100 ml/min) and selenium vapor. During these experiments, selenium shot (Delta Chemical Works, Inc., USA) was kept at 300° C. in the inlet of the reactor and provided the selenium atmosphere (ca. 0.5 mm Hg) for the gas phase reaction. The reaction was carried out at various temperatures.

The following sequence was used for the selenization process. After the furnace and selenium source reached the desired temperature, the samples were introduced into the hot zone of the reactor (using a magnet from outside the quartz tube) under the flow of the forming gas for 1 hour, and then moved back to the unheated zone of the reactor and allowed to cool down to room temperature under the same gas atmosphere.

The reaction products were characterized by X-ray diffraction (XRD, model "ROTAFLEX" RU-200 B Rigaku, Cu Ka anode); X-ray photoelectron spectroscopy (XPS, model AXIS HS Kratos, Mg Ka anode); Optical absorption spectroscopy (OAS, "UVIKON-810") in the range 300–850 nm and scanning electron microscopy (SEM, Jeol model 6400 and Philips model 515 equipped with energy dispersive X-ray analysis (EDS) model Tracor 5500).

All the films exhibited the $2H-WSe_2$ hexagonal structure. Both XPS and EDS analyses, in which the composition of the film was compared with that of the single crystal, confirmed that the film consists of $WSe_2$. XRD spectra of $WSe_2$ films prepared on a Ni(30 Å)/quartz substrate at different temperatures show that only (001) lines were present in the diffraction pattern at 950° C., indicating van der Waals planes of the $WSe_2$ parallel to the substrate. The crystallinity and texture of the film improved substantially with the annealing temperature. For annealing temperature of 650° C., poor crystallinity and texture were observed. The average crystallite size was found to be 600 and >1000 Å at 800 and 950° C., respectively. The height of the (002) peak was found to be about ⅔ of the intensity of the same peak in single crystal $WSe_2$, measured under similar conditions (the difference is larger though for the (006) and (008) peaks which are influenced by the long range order in the film). However, the adhesion of the film to the substrate was relatively poor in this case.

Thicker Ni buffer films (200 Å) were studied as well and yielded similar results. It emerges therefore, that the thickness of the interfacial Ni film is not a relevant parameter for determining the crystallinity and texture of the top $WSe_2$ film.

The measured values of the interplanar spacing of the various planes are in a good agreement with ASTM data file 38-1388. The c and a length parameters are 12.9765 Å and 3.2843 Å and coincide with previously reported values.

The large differences in peak intensities and widths, for films prepared on different substrates, reveal that the intermediate Ni (Ni—Cr) layer influences the kinetics of crystallization and possibly the reaction mechanism. The degree of crystallinity of the $WSe_2$ films is obviously much better when an intermediate Ni, or Ni—Cr layer exists. Furthermore, the crystallinity and texture were shown to improve with increasing reaction temperature.

In certain applications it may be desirable to form superstructures which feature various chemical species. For example, one can form a number of layers wherein the chemical makeup of one or more layers differs from that of an adjoining layer or group of layers. Similarly, each layer may be made up of a single chemical species or may include a mixture of a number of such species.

EXAMPLE 8

Figure 2A:
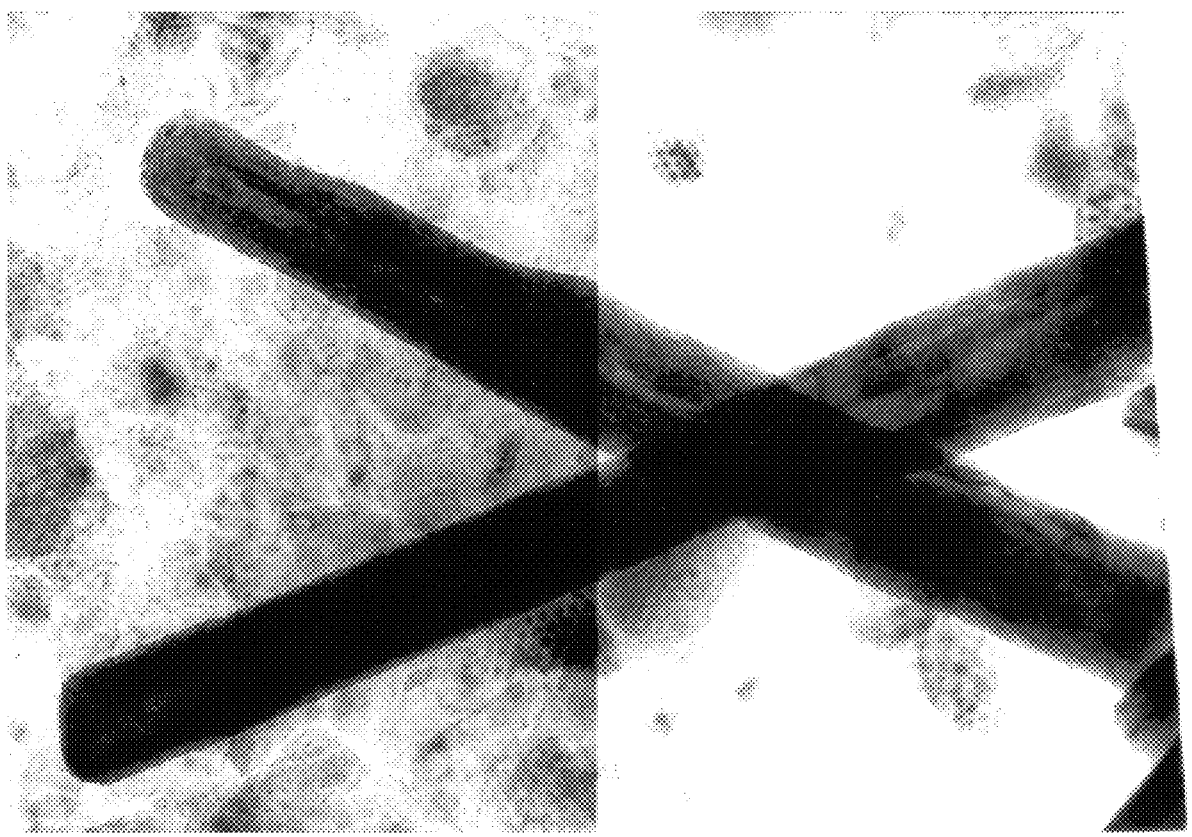
FIG. 2a is transmission electron microscope (TEM) view of nanotubes of $WS_2$ according to the present invention.
Figure 2B:
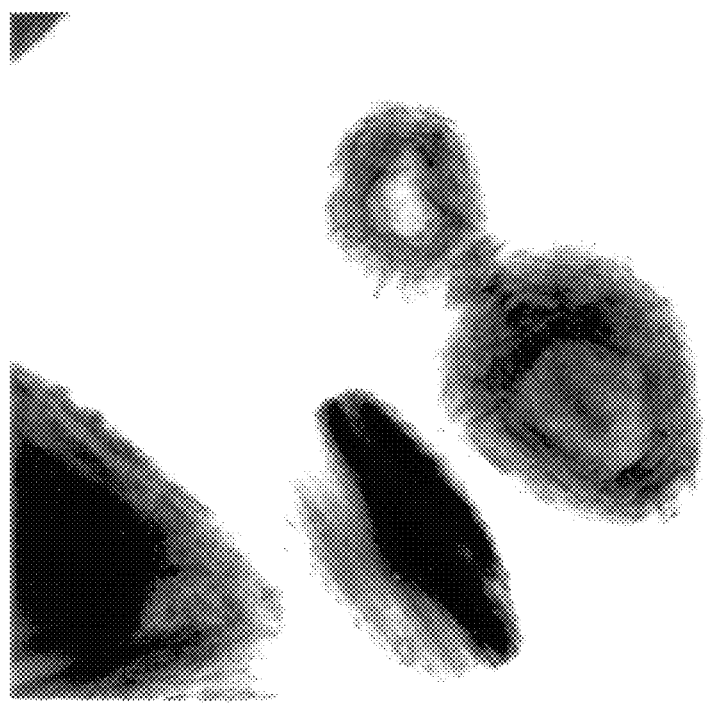
FIGS. 2b and 2c are TEM views of a nested polyhedra structure of $WS_2$ according to the present invention.
Figure 2C:
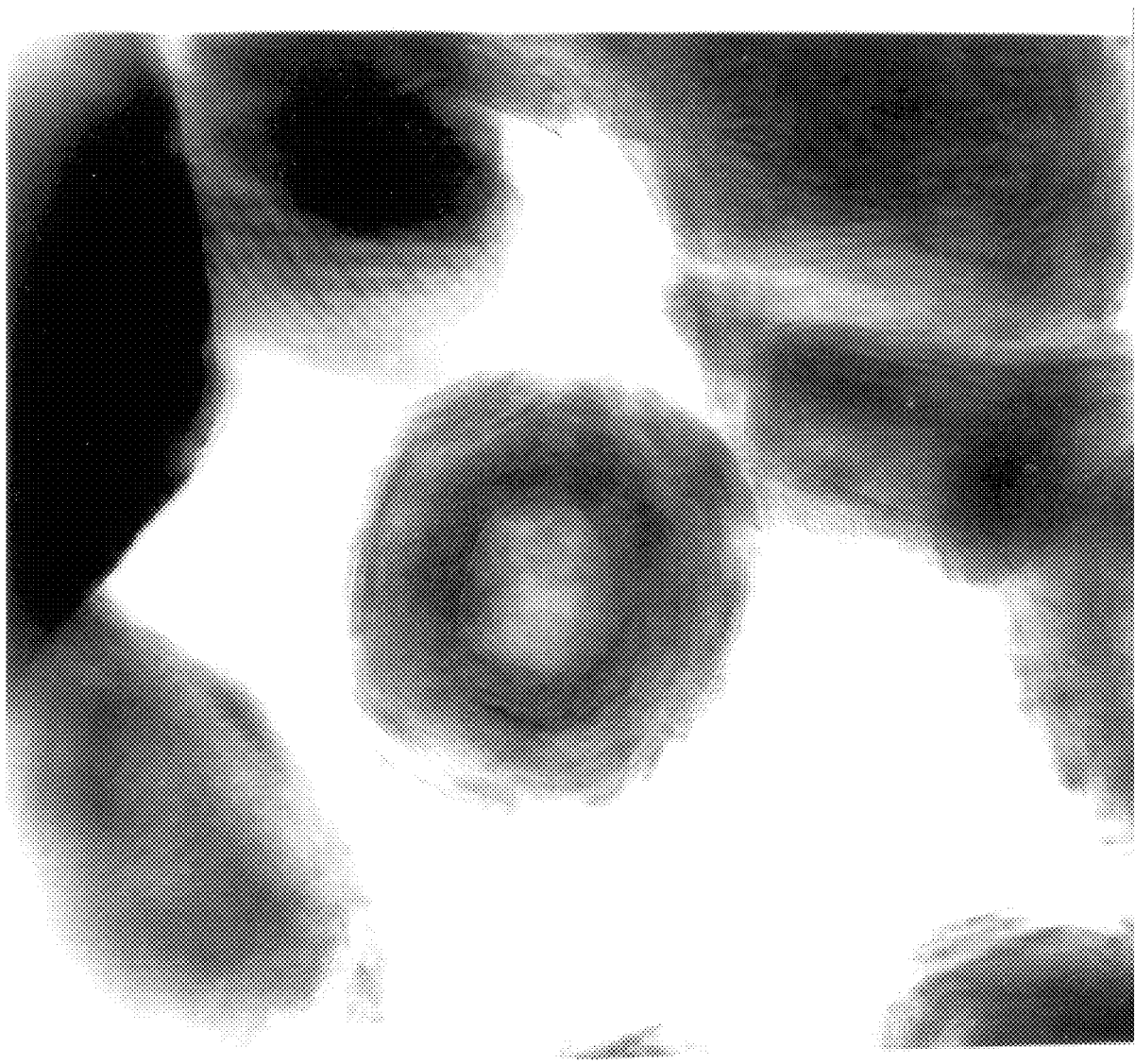

A thin film of tungsten was deposited on quartz as in Example 4. This film was annealed at 1000° C. for 70 minutes in an argon flow with residual sulfur from the walls of the quartz reaction tube followed by 60 minutes in a flow of pure $H_2$. While the film was composed predominantly of flat crystals oriented with the Van der Waals planes parallel to the substrate, some nanotubes and inorganic fullerenes of $WS_2$ were also formed. The nanotubes were several hundred nm long and several tens of nm in diameter, and were formed of many concentric $WS_2$ tubes as shown in FIG. 2a. FIGS. 2b and 2c show nested polyhedra of $WS_2$.

It has thus been found that the $WS_2$ crystals can, in some cases, curve to form essentially concentric structures of substantially cylindrical shape. These structures have a decided advantage for photovoltaic cell purposes, in that the amount of exposed edge face is much less than for the equivalent flat crystals. Such structures may be useful for other purposes, apart from photovoltaic cells, such as solid lubrication, because of their nanoscale structure. Thus, they could, in principle, be used as quantum wires and modified by introducing foreign atoms or molecules either into the Van der Waals gaps between layers (intercalation) or into the hollow center of the tube.

EXAMPLE 9

Nested polyhedra based on $WS_2$ were obtained in large quantities and with various structures by the following method. A thin film of W or $WO_X$ (100–300 Angstroms) was deposited on a quartz substrate by electron beam or ion beam deposition. The sample was introduced into the furnace where it was fired for approximately one hour at 950 to 1050° C. in the presence of air. This leads to the creation of a stoichiometric trioxide layer as confirmed by various measurements. Subsequently, the quartz tube of the furnace was closed and a stream of $H_2S$ (1–5 ml/min) and forming gas (5% $H_2$, 95% $N_2$, 50–150 ml//min) were passed through the system for one to two hours, usually without altering the temperature. After the samples were allowed to revert to ambient conditions they were taken for various analyses, of which transmission electron microscopy (TEM) with imaging and selected area electron diffraction (SAED) were the most relevant for the determination of the nested polyhedra. Polyhedra were found to be most abundant when the sample was fired at 1050° C.

EXAMPLE 10

Figure 3:
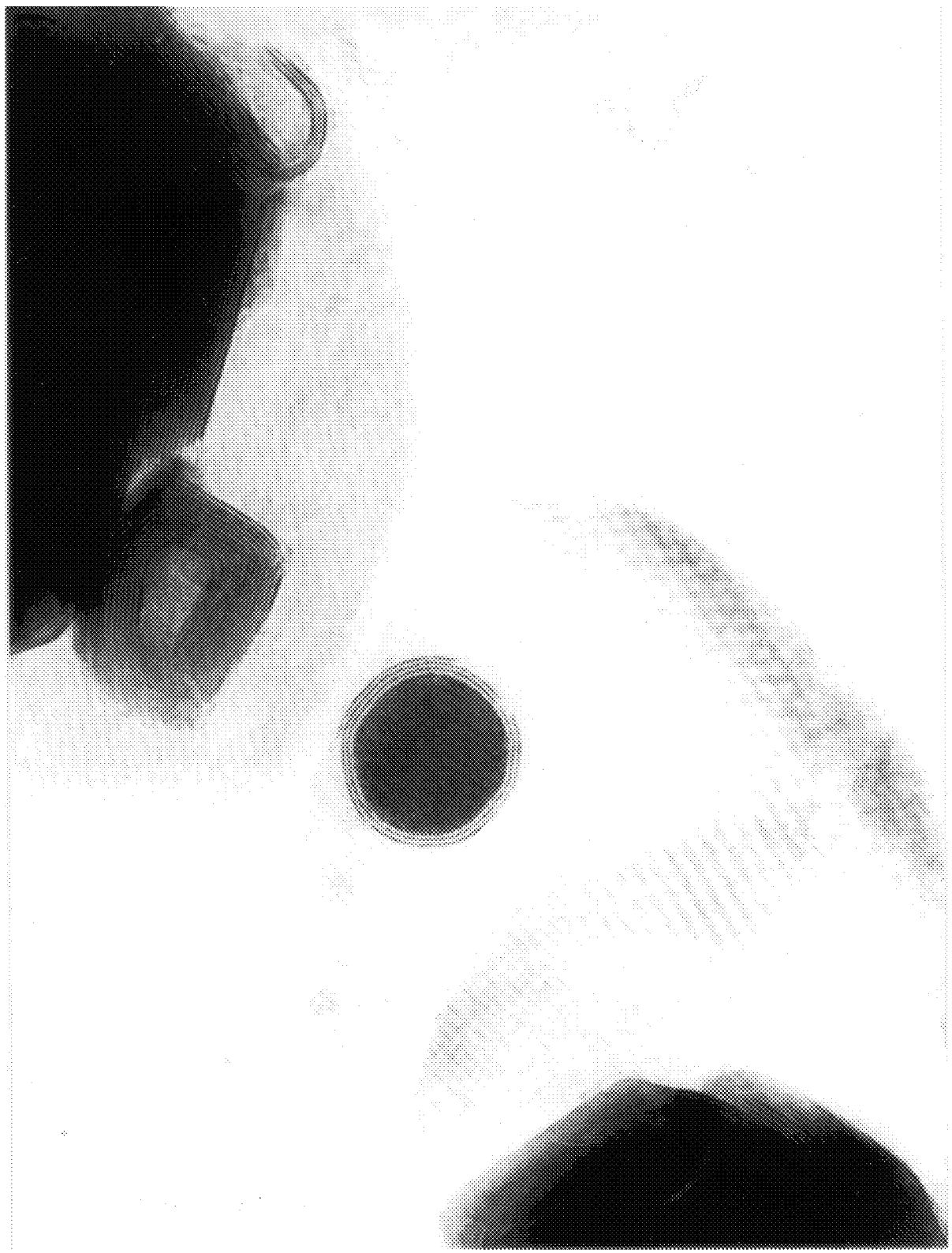
FIGS. 3 and 4 are two TEM views of $MoS_2$ nested polyhedra structures made as described in Example 10—a hollow structure (FIG. 3) and Mo-filled structure (FIG. 4)
Figure 4:
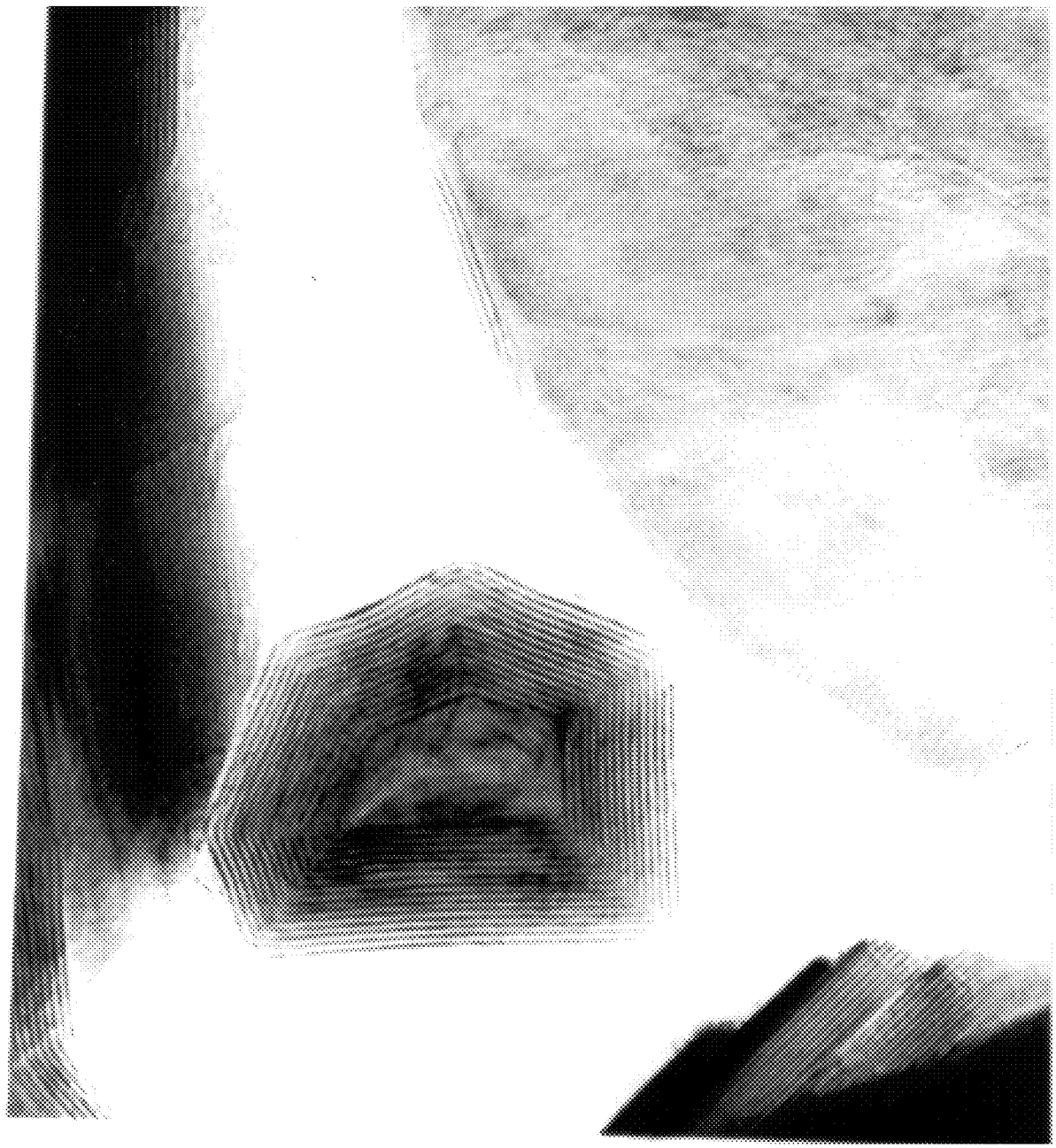

Nested polyhedra based on $MoS_2$ were produced by using a similar method to that described in Example 9 above. However, since $MoO_3$ is much more volatile than $WO_3$, it was necessary to perform the annealing at lower temperatures (950° C.), and hence the structures were less abundant, and possibly different in growth mechanism, from those obtained with $WS_2$. Two typical structures were obtained—(1) round-shaped polyhedra consisting of a very few layers (2 to 5) and a dark core which is suspected of being of metallic nature, as shown in FIG. 3, and (2) hollow structures with many (>10) layers of $MoS_2$, as shown in FIG. 4. The fringe contrast in the polyhedra was preserved on tilting the sample, while the fringe contrast of nearby platelets was lost upon tilting the sample, which is a clear indication in support of the close nature of the polyhedra. This is confirmed also by SAED which showed the diffraction pattern of two perpendicular planes at the same time.

EXAMPLE 11

Nested polyhedra, here inorganic fullerenes (IF) and nanotubules of $MoSe_2$ and $WSe_2$ were obtained by first evaporating a thin film (ca. 200 Angstroms) of $MoO_X$ ($WO_X$) on a quartz substrate and annealing these films in an atmosphere of forming gas ($N_2/H_2$=95/5) and Se gas at temperatures below 850° C. for 5–30 minutes. The film was peeled off from the quartz substrate by dipping the entire sample in a 1–5% HF for ca. 10 minutes, and transferred onto Cu grids for examination by transmission electron microscope, or scanning tunneling microscope. Nested polyhedra of radiuses of 5–60 nm were observed. The transformation of the oxide into the IF phase could be described by a series of chemical and physical transformations in which an amorphous phase transforms into the stable (2H) crystalline phase through a metastable phase which consisted of IF. This process resembles the transformation of amorphous carbon soot into bulk graphite, through a metastable fullerene phase. It also resembles the transformation of Al—Mn amorphous alloys into the bulk crystalline phase through a metastable icosahedral phase (Schechtmanite). This similarity lends itself to an alternative process for IF production by quenching the melt (i.e., rapid cooling of the melt, where it exists).

EXAMPLE 12

IF were also produced by irradiating amorphous $MOS_X$ ($WS_X$) films with an intense electron beam. The amorphous film was produced by a short anneal of the metal-oxide in the reducing atmosphere of the forming gas together with $H_2S$ (S). Depending on the duration and intensity of the beam, the process could take a few tens of minutes to hours. A regime of intermittent irradiation was advantageous for the control of the IF sizes. Other sources of electromagnetic radiation and/or particle beam irradiation, such as intense ion beam, laser zapping, and the like, may also be useful for this purpose.

Further in accordance with the present invention, a method and apparatus for synthesizing single layer, nested and nanotubes and inorganic fullerenes of transition metal chalcogenides, in particular copious quantities (a few mg in each run) of nested fullerenes of $MoS_2$, have been developed. The process in general includes the steps of mixing a transition metal material, such as an oxide of a transition metal, with a gaseous chalcogenide in a reducing atmosphere at a temperature between about 750° C. and about 1000° C., and preferably between about 800° C. and 900° C. When the correct reducing atmosphere and gas flow rate and substrate location relative to the mixing point are reached, large quantities of inorganic fullerenes or nanotubes can be collected. The synthesis can be a gas phase reaction or can be a solid/gas reaction, as described in detail hereinbelow. When the reaction is run in the gas phase, structures within a narrow size distribution are collected.

The gas phase synthesis of IF of $MoS_2$ makes use of the fact that substoichiometric $MoO_{3-x}$ sublimes around 650° C. To obtain the $MoO_{3-x}$ gas, a boat containing $MoO_3$ is heated in a forming gas atmosphere. Special care must be paid to the reducing conditions. If the reducing atmosphere is too strong, Mo metal is obtained and no transport of Mo can take place. If, however, the reducing atmosphere is too weak, mixed oxides-sulfides are formed and fullerenes are not observed.

The hydrodynamics of the flow pattern has a marked influence on the reaction products. For example, the distance of the substrate (about 3 cm) from the source (where the two gas beams cross) is very important, as well as the relative position of the two gas flows with respect to each other.

Two kinds of substrates were used. When a quartz substrate alone was used, copious amounts of nested $MoS_2$ fullerenes were collected. The IF had quite a uniform size with an average diameter of 30 nm. When a narrow (about 100 micrometer), long (few mm) tube for inflow of $MoO_{3-x}$ was used, a substantial number of nanotubes of a 10–20 nm external diameter and 2–5 $\mu$m length were obtained on the quartz substrate.

When the quartz substrate was covered with a thin (10 nm) film of a metal which spontaneously forms a sulfide of 2-D structure in the reaction chamber, like $NbS_2$, tiny polyhedra and single layer nanotubes were "trapped" on the substrate surface. For example, Nb thin metal film on the quartz substrate was used and $MoS_2$ IFs of two layers and 4–8 nm diameter were obtained, with a very few having up to 30 nm diameter. The Nb itself transformed in the chamber into the 2-D compound $NbS_2$, which trapped the tiny $MoS_2$ IFs. With a Ti substrate, a few $MoS_2$ nanotubes were trapped, which were fixed to the $TiS_2$ matrix very strongly. In the presence of Ti or Nb oxides as small crystallites on the substrate, encapsulation of the oxides by the $MoS_2$ ($WS_2$) fullerenes occurs, leading to stuffed or encapsulated fullerenes.

The gas phase route to the generation of IF and nanotubes is not limited to these examples. A number of other chemical reactions in a reducing atmosphere and at temperatures between about 750° C. and about 1000° C. will yield this brand of new materials. In particular volatile compounds of a transition metal with a chalcogen-containing gas will result in IF or nanotubes. Some examples follow.

Reaction between metal oxide, where the metal is Ti, V, Cr, Co, Zr, Nb, Mo, Pd, Hf, Ta, W, Re, Ir, Pt, Sn, In, Ga, etc., and $H_2X$ or X, where X is S, Se or Te. In this case, a metal oxide is heated in a reactor that provides adequate vapor pressure (i.e., $Re_2O_7$ sublimes at 250° C.) and a reducing atmosphere for the reaction with $H_2X$, which is a gas at ambient conditions. If X is used for the reaction, a separate reactor to provide enough vapor pressure of X is required. This is easily achieved by using an auxiliary heater, downstream of the reactor chamber, in which a boat containing the X shot is contained. Thus, the gas stream takes the chalcogen gas into the main chamber where it reacts with the metal oxide.

Metal halides, like $MoCl_5$, $NbBr_5$, $NbCl_5$, $HfCl_4$, $SnBr_4$, $SnCl_4$, $TiCl_4$, $TiI_4$, $ZrCl_4$, $CrF_5$, $PtCl_4$, $InCl_3$, $InBr_3$, $GaCl_3$, and so on are very volatile and can replace the oxides.

Metal oxide halides, such as $WOCl_4$, $MoOCl_4$, and $MoO_2Cl_2$ can be used. So can organometallic compounds, including $Nb(C_2H_5O)_5$ and $Nb(C_6H_5O)_5$, $Hf(C_5H_4O_2F_5)_4$, $Ti(C_2H_5O)_4$, $Ti(C_8H_{17}O)_4$, $Zr(C_2H_5O)_4$, and tri-methyl gallium (indium). Similarly, metal carbonyls such as $Mo(CO)_6$ and $Cr(CO)_6$ are operative. Some layered compounds are very volatile and can be used as such for the gas phase synthesis of fullerenes. These include $PbI_2$, $CdCl_2$, $CdI_2$ and $HgI_2$.

$CS_2$ can be used to replace the $H_2S$ (S) gas. In this case, the $CS_2$ liquid can be maintained in a separate beaker downstream of the main reactor. Forming gas is bubbled through the beaker so the $CS_2$ saturates the forming gas which enters the reactor.

In order to form the elusive IF phase of $MoS_2$ from $H_2S$ and $MoO_3$ in a reducing atmosphere at elevated temperatures, careful control of the reducing atmosphere in the reaction chamber is a prerequisite. If the reducing atmosphere is too strong, metallic molybdenum, which has an exceedingly low vapor pressure at these temperatures, results. On the other hand, if the reducing atmosphere in the reactor is not sufficiently strong, oxi-sulfides of molybdenum with an orthorhombic structure are collected on the substrate.

The dominant phase in the Mo-S phase diagram in the low temperature and excess sulfur regime is the amorphous $MoS_3$ compound. On elevating the reaction temperature, $2H-MoS_2$ predominates. This situation is favorable for the growth of IFs, because by losing sulfur the a-$MoS_3$ phase is expected to slowly transform into nanocrystallites of $MoS_2$ in the gas phase and spontaneously collapse into IFs.

Referring now to FIG. 8, there is shown a schematic illustration of one embodiment of the apparatus according to the invention for synthesizing IFs. The apparatus includes a reactor generally designated 10 including a quartz tube 12 disposed in a furnace 14. Within quartz tube 12 is disposed a boat 16 in 15 which a substrate 18 is placed.

The main gas flux enters quartz tube 12 flowing towards substrate 18. An inlet tube 22 for a second gas flux is provided in quartz tube 12 to separate the gas fluxes. The exit of inlet tube 22 is arranged so that the second gas flux will intersect the main gas flux and react. Preferably the two gas flows intersect at an angle of about 90° with respect to one another. The size and shape of the inlet tube 22 are adjusted so as to produce the desired IFs or nanotubes. This structure results in IF particles of homogenous size.

Powdered transition metal material, such as the oxide (here $MoO_3$) is placed in inlet tube 22 and forming gas is introduced therethrough to provide $MoO_{3-x}$ gas for the gas phase reaction. Alternatively, powdered transition metal material can be placed in a boat in the main gas flux and will react with the chalcogen gas in a solid/gas reaction. In this case, no preliminary vaporization of the transition metal material is required.

To ensure the appropriate reducing atmosphere in each of the gas streams, two separate sources of forming gas (5% $H_2/95\%$ $N_2$ mixture) were necessary. The flow of the various gases was automatically controlled. Any small change in the flow regime adversely influenced the reaction products. A turbulent flow regime, which was difficult to control and maintain, was found to yield the best and most reproducible results. In order to produce this turbulent regime, the quartz collecting substrate 18 was put behind a high wall (about 2 mm above the crossing point of the gases) of the boat 16 about 3 cm upstream from the crossing point of the two gases. The quartz slides with the products were used as such for the x-ray diffraction (XRD), or the products were transferred onto Cu grids for inspection in a transmission electron microscope (TEM).

It will be appreciated that each transition metal material is somewhat different, therefore requiring slightly different reaction conditions to produce IFs. A window of conditions exists for each reaction, including composition of reducing atmosphere, flow rate of the various gases, temperature, distance of substrate from the reaction point, and so on, which will result in large quantities of IFs or nanotubes being produced and captured. Once this window is found for a particular reaction, that reaction is totally reproducible.

Figure 9A:
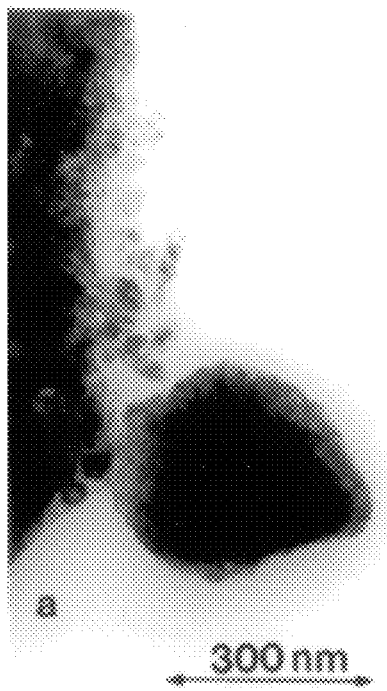
FIGS. 9a to 9f are a series of TEM images showing the structure of IF-$MoS_2$ formed at different temperatures by the method of the present invention.
Figure 9B:
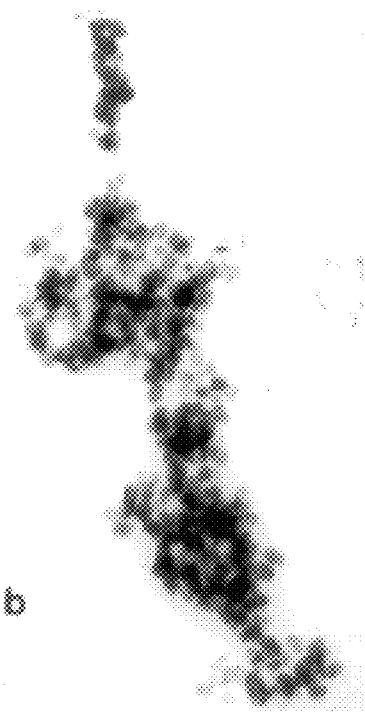
Figure 9C:
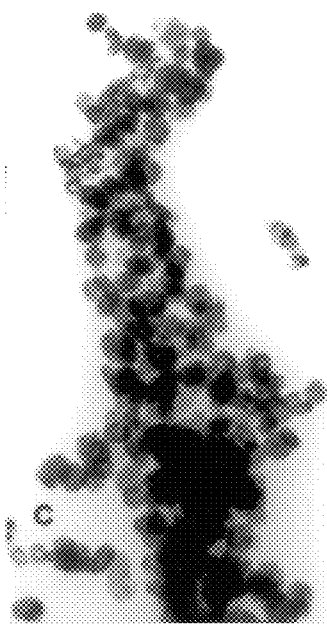
Figure 9D:
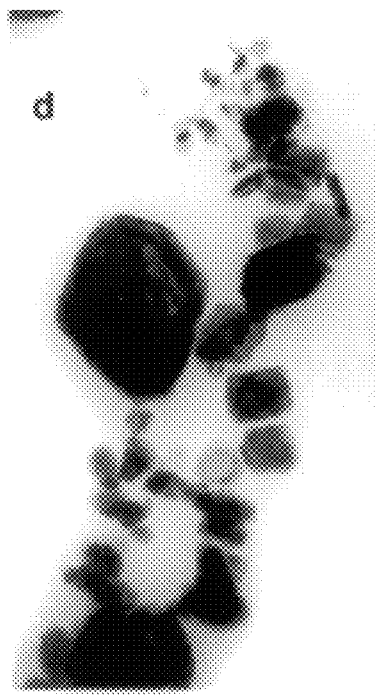
Figure 9E:
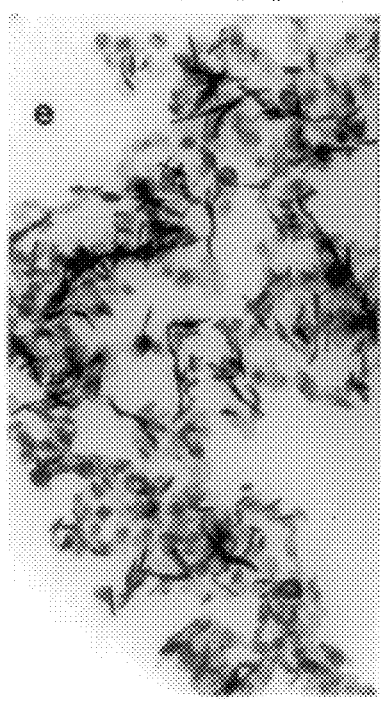

A series of TEM images from the various IF $MoS_2$ reaction products which were obtained at different temperatures is shown in FIGS. 9a through 9f. For temperatures up to 800° C., an amorphous phase was obtained (FIG. 9a), which yielded a broad peak in XRD and a fuzzy electron diffraction pattern. Growth at 820° C. produced IFs of average size of 20 nm in (external) diameter as seen in FIG. 9b. The average size of the IFs increased with increasing reaction temperature. A typical example obtained at 840° C. is shown in FIG. 9c. Here the average external diameter is about 40 nm. When the reaction was allowed to proceed for 2 hours instead of 1 hour, there was no noticeable change in the IF size distribution. This result suggests that the sizes and morphologies of the IF are determined during growth in the gas phase. It further alludes to the possibility that the products of the gas phase reaction were obtained under quasi-equilibrium conditions.

At a growth temperature of 900° C., the external diameter of the IFs was 100 nm and the wall thickness was approximately 20 nm. This can be seen in FIG. 9d which also shows platelets of 100 to 300 nm size and above, belonging to the $2H-MoS_2$ polytype, which start to appear at this temperature. If the temperature of the reactor is further increased, the fraction of the $2H-MoS_2$ predominates and becomes the sole phase at 950° C. In this case, most of the crystallites were oriented with their <0001> axis perpendicular to the substrate. Higher annealing temperatures yielded even larger crystallites of the same phase.

Figure 9F:
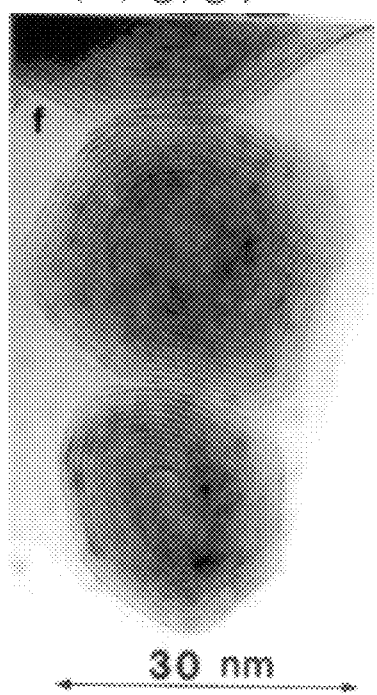

These IFs represented the most prevalent phase in the film only under a turbulent flow regime. They were visible only very rarely in the laminar flow regime (see FIG. 9e), even at temperatures (840° C.) where IFs predominate under turbulent flow regime. A high-resolution image of two IFs obtained at 840° C. under a turbulent flow regime is shown in FIG. 9f. The distance between each two fingers is $c/2=0.62$ nm. The fluxes of the various gases in the reactor are: $H_2S$, 1.5 $cm^3$/min; $H_2(5\%)/N_2(95\%)$—90 $cm^3$/min in main tube 20, and 30 $cm^3$/min in second tube 22 (see FIG. 8).

Systematic analysis of the radius and thickness of some 110 IFs, which were prepared at 850° C., was performed. Of this number, 28 IFs with a spherical internal (hollow) core are reported in Table II. The samples were taken from a few different batches, each one prepared under somewhat different conditions as set out in Table II. The flow rates of the gases for the different samples were as follows: $H_2(5\%)/N_2$ (95%); $H_2S$: 90;1.5 cm$^3$/min for samples a, c, e; 115;1.5 for sample d; and 70;1 for sample b. $H_2(5\%)/N_2(95\%)$ for the second tube 22 was 30 cm$^3$/min for samples a, c, d, e and 40 for sample b.

The different IFs were arranged according to an ascending thickness h of the spherical shell (along the columns) and ascending radius r of the (hollow) core of the IF (along the rows). The upper row is an average r value which increased by c/2=0.6 nm. The innermost layer of the IF is always complete, and the value of h increases by 0.6 nm, which is approximately c/2, along the columns. This result shows that the IFs are made of complete layers and not of patches of 2H-MoS2 "glued" together through grain boundaries. The analysis also shows that the average radius of the hollow core increases also by 0.6 nm along the rows from the smallest radius observed, 1.4 nm. A still smaller inner radius of 0.8 nm cannot be excluded, although it has not been observed. This result suggests that well-defined steric criteria determine the structure of the innermost layer of the IFs.

the growth of the IF phase. Both the TEM and XRD results confirmed the importance of the turbulent flow regime for the production of the IF phase. The increased van der Waals gap (c/2) of the IF suggests an easier intercalation of small alkali ions into the IF compared with the bulk 2H polytype.

Light absorption measurements and scanning tunnelling microscopy (spectroscopy) show that the IF are semiconductors with a bandgap of about 0.1 eV less than the 2H bulkface. Thus, the 2H-MoS$_2$ exhibits an indirect bandgap of about 1.2 eV at room temperature and a bandgap of IF MoS$_2$ was found to be about 1.1 eV. Similarly, the excitonic transitions of the IF MoS$_2$ phase exhibited 40–100 meV red shift (1.82 eV) compared to the 2H-MoS$_2$ (1.86 eV) at room temperature.

Figure 10A:
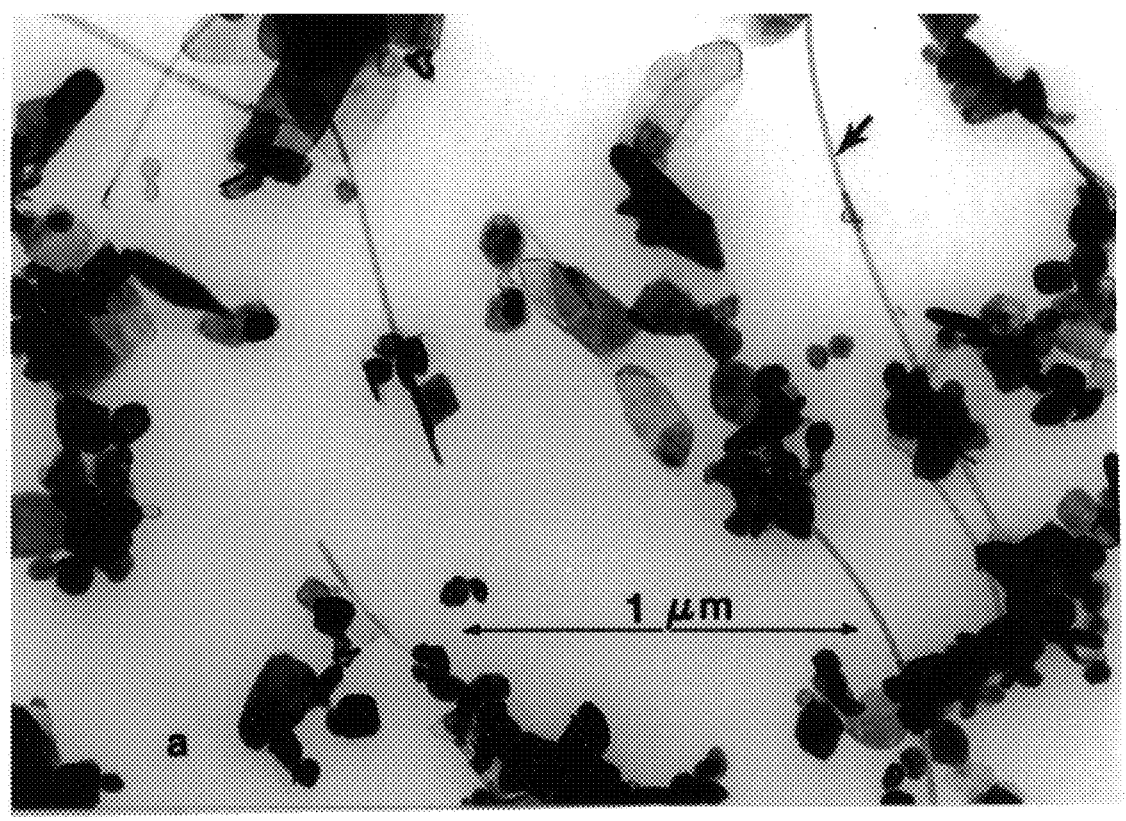
FIG. 10a is a TEM image of an assortment of nanotubes obtained by the gas-phase reaction of $MoO_{3-x}$ and $H_2S$ according to one embodiment of the method of the invention.

Minor changes in the reactor design resulted in the production of substantial amounts of nanotubes of up to 5 μm in length and diameters of 10–20 nm as seen in FIG. 10a. This occurred when the inlet tube of the gas mixture containing MoO$_{3-x}$ was made very narrow. The nanotubes, which were obtained in this way, are very uniform in shape

TABLE II k—number of shells
h—thickness [nm]

| k | h | 1.4 | 2.0 | 2.6 | 3.2 | 3.8 | 4.4 | 5.0 | 5.6 | 6.2 | 6.8 |
|---|---|---|---|---|---|---|---|---|---|---|---|
| 3 | 1.86 | | | | 3.2A | 3.7a | | 4.8b | | | |
| 4 | 2.48 | | | 2.6b | 3.2a | | | | | | |
| 5 | 3.1 | | | 2.6c | | | | | | 6.5b | |
| 6 | 3.72 | | | 2.6a | 3.2b | | | | | | |
| 7 | 4.34 | | 2.1e | | | | | | | 6.0d | |
| 8 | 4.96 | | | | 3.1a | | | | | | |
| 9 | 5.58 | | | 2.6e | | | | | | | 7.0a |
| 10 | 6.2 | | 2.0a | 2.6e | | | | | | | |
| 11 | 6.82 | 1.5e | | 2.6c | | | | | 5.6a | | |
| 12 | 7.44 | | 1.9a | | 3.4e | | | | | | |
| 13 | 8.06 | | | | 3.3b | | | | | | |
| 14 | 8.68 | | 1.9e | | | 3.9c | | | | | |
| 15 | 9.3 | | | | 3.4b | | | | | | |
| 16 | 9.92 | | 2.0d | | | | | | | | |
| 17 | 10.54 | | | | | | | | | | |
| 18 | 11.16 | | | 2.6b | | | | | | | |
| 19 | 11.78 | | | | | | 4.2e | | | | |

A series of XRD spectra for the various films prepared on quartz substrates were examined. The (0002) peak position in the XRD pattern depended not only on temperature but also on the flow regime, as expected from the TEM results. The XRD pattern for the film prepared in the turbulent flow regime at temperatures between 800 to 900° C. corresponded to the IF phase seen in TEM. The sample prepared at 840° C. showed an average expansion of 2% along the C axis compared with the 2H phase. The average size of the crystallites was calculated from the Debye-Scherrer formula to be 40 nm (see also FIG. 9c). Upon increasing the temperature to 900° C., the intensity of the peak increased and the shift from the peak position of the 2H phase decreased. The average size of the crystallites was 100 nm at this temperature, which suggests a reduced strain for the larger IF.

Figure 10B:
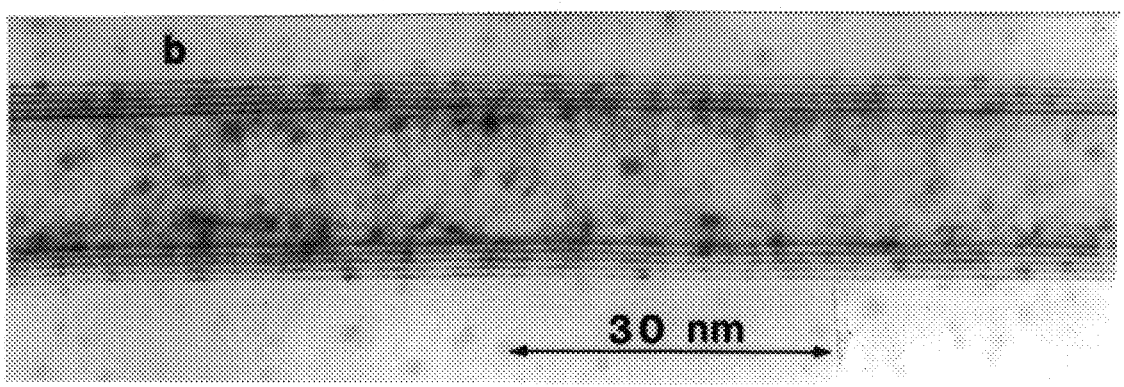

The XRD spectrum of the specimen obtained within the laminar flow regime at 840° C. corresponded to the 2H bulk phase. The low intensity and the large width of the peak suggested that the crystallites were very small. TEM observations showed that these crystallites were in the form of small platelets (15 nm). The XRD spectra of the samples which were heated to T≧950° C. corresponded to the bulk 2H phase, independent of the flow regime. The XRD results were consistent with the TEM observations and confirmed (see FIG. 10b): most of them contained between 5 and 10 layers of MoS$_2$ and their length exceeded a few micrometers. In fact, many of the nanotubes were cut during the transfer process onto the Cu grid. The nanotubes were mixed with a separate phase consisting of 2H-MoS$_2$ platelets. This process allows a reproducible production of copious amounts of nanotubes, although still not as the major constituent as in the case of IF.

The reactions to synthesize IFs discussed above were conducted as gas phase reactions, wherein both the transition metal material and the chalcogenide material were gases during reaction. Alternatively, the transition metal material can be reacted in the form of a solid powder which is carried by the reducing gas into contact with the chalcogenide gas, rather than being vaporized first. Example 13 is an example of such a solid/gas reaction.

EXAMPLE 13

Nested polyhedra of WS$_2$ were obtained in large quantities by the following method: 1 gram of a fine powder of WO$_3$ was ground in an agate mortar to a grain size of about 100 nm. The ground powder was put in a quartz boat which was placed in a quartz tube in a furnace. A stream of H$_2$S (1–5 ml/min) and forming gas (50–150 ml/min) was passed through the tube. The boat with the $WO_3$ was moved into the hot part of the furnace, which was maintained at 950° C. for 2 hours. The resulting powder was analyzed with TEM and SAED and also XRD. It was found to be in the form of nested polyhedra of $WS_2$ of a typical size of 100 nm, similar to the grain size of the starting $WO_3$. Starting with $WO_3$ powder of grain size of 200 nm, under the same experimental conditions, resulted in nested polyhdera of $WS_2$ of a diameter of 200 nm.

While the invention has been described with respect to several preferred embodiments, it will be appreciated that many variations, modifications and other applications of the invention may be made.

What is claimed is:

1. A fullerene-like or nanotube structure of a transition metal chalcogenide.

2. A structure as in claim 1 having a substantially circular cross-section.

3. A structure as claimed in claim 1 which is a member selected from the group consisting of single layer inorganic fullerene-like structures, nested layers inorganic fullerene-like structures and stuffed inorganic fullerene-like structures.

4. A structure as claimed in claim 2 which is a member selected from the group consisting of single layer inorganic nanotube structures, nested layers inorganic nanotube structures and stuffed inorganic nanotube structures.

5. An inorganic fullerene structure in accordance with claim 1 of a transition metal chalcogenide.

6. An inorganic nanotube structure in accordance with claim 1 of a transition metal chalcogenide.

* * * * *